(12) United States Patent
Ku

(10) Patent No.: US 7,847,612 B2
(45) Date of Patent: Dec. 7, 2010

(54) LEVEL SHIFT CIRCUIT

(75) Inventor: Tzong-Yau Ku, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 0 days.

(21) Appl. No.: 12/368,955

(22) Filed: Feb. 10, 2009

(65) Prior Publication Data

US 2010/0201425 A1    Aug. 12, 2010

(51) Int. Cl.
*H03L 5/00* (2006.01)
(52) U.S. Cl. .............................. 327/333; 326/62; 326/81
(58) Field of Classification Search ............. 326/62–63, 326/80–81; 327/306, 333
See application file for complete search history.

(56) References Cited

U.S. PATENT DOCUMENTS

| | | | | |
|---|---|---|---|---|
| 5,406,141 A | * | 4/1995 | Yero et al. | 326/68 |
| 5,698,993 A | * | 12/1997 | Chow | 326/81 |
| 6,002,290 A | * | 12/1999 | Avery et al. | 327/333 |
| 6,130,556 A | * | 10/2000 | Schmitt et al. | 326/81 |
| 6,580,291 B1 | * | 6/2003 | Lutley | 326/81 |
| 7,161,387 B2 | * | 1/2007 | Yamasaki et al. | 326/81 |
| 7,215,146 B2 | * | 5/2007 | Khan | 326/83 |
| 7,425,860 B2 | * | 9/2008 | Nomura | 327/333 |
| 7,436,213 B2 | * | 10/2008 | Nojiri | 326/81 |

* cited by examiner

*Primary Examiner*—Dinh T. Le
(74) *Attorney, Agent, or Firm*—Winston Hsu; Scott Margo

(57) ABSTRACT

A level shift circuit includes: a first transistor coupled to a first reference voltage for receiving a first voltage input signal; a second transistor coupled to a second reference voltage; a first diode-connected transistor coupled between the second transistor and the first diode-connected transistor; a third transistor coupled to the first reference voltage and the second transistor, for receiving a second voltage input signal, wherein the first voltage input signal is an inverse version of the second voltage input signal; a fourth transistor coupled to the second reference voltage and the first transistor; a second diode-connected transistor coupled between the fourth transistor and the third transistor; and a fifth transistor coupled to the second voltage input signal, the first reference voltage, and the fourth transistor, wherein a level-shifted output signal corresponding to the first voltage input signal is generated at an output node of the fourth transistor.

18 Claims, 3 Drawing Sheets

LEVEL SHIFT CIRCUIT

BACKGROUND OF THE INVENTION

1. Field of the Invention

The present invention relates to a level shift circuit, and more particularly, to a level shift circuit of a source driver.

2. Description of the Prior Art

In LCD (Liquid Crystal Display) driving systems, a level shift circuit is frequently used to generate a high voltage output from a lower voltage input for a source driver to drive the liquid crystal cells of the LCD panel. Please refer to FIG. 1. FIG. 1 is a diagram illustrating a level shift circuit 100 according to the prior art. The level shift circuit 100 comprises a differential input pair cascaded with a cross-coupled pair coupled between a first supply voltage $V_{DDA}$ and a second supply voltage $V_{SSA}$ as shown in FIG. 1. Furthermore, the differential input pair comprises an NMOS transistor Ma having a control gate for receiving a first input signal $S_a$, and an NMOS transistor Mb having a control gate for receiving a second input signal $S_b$. The cross-coupled pair comprises a PMOS transistor $M_c$ and a PMOS transistor $M_d$ for respectively outputting a first output signal $S_{out1}$ and a second output signal $S_{out2}$ according to the first input signal $S_a$ and the second input signal $S_b$. Normally, the first input signal $S_a$ and the second input signal $S_b$ are configured as a differential signal within a voltage range, smaller than the voltage range of $V_{DDA}$ and $V_{SSA}$. Therefore, when the first input signal $S_a$ is at a logic high level and the second input signal $S_b$ is at a logic low level, the PMOS transistor $M_c$ and the PMOS transistor $M_d$ latch the first output signal $S_{out1}$ to the first supply voltage $V_{DDA}$, and the NMOS transistor $M_a$ discharges the second output signal $S_{out2}$ to the second supply voltage $V_{SSA}$ (and vice versa). Therefore, the level shift circuit 100 shifts the voltage level of the input signals $S_a$, $S_b$ to the output voltage level of either the supply voltage $V_{DDA}$ or the ground voltage $V_{SSA}$.

SUMMARY OF THE INVENTION

One of the objectives of the present invention is to provide a level shift circuit of a source driver.

According to an embodiment of the present invention, a level shift circuit is disclosed. The level shift circuit comprises a first transistor, a second transistor, a first diode-connected transistor, a third transistor, a fourth transistor, a second diode-connected transistor, and a fifth transistor. The first transistor has a first node coupled to a first reference voltage, and a control node receiving a first voltage input signal. The second transistor has a first node coupled to a second reference voltage. The first diode-connected transistor has a first node coupled to a second node of the second transistor, and a second node coupled to a control node of the first diode-connected transistor. The third transistor has a first node coupled to the first reference voltage, and a control node receiving a second voltage input signal (S2), wherein the first voltage input signal is an inverse version of the second voltage input signal. The fourth transistor has a first node coupled to the second reference voltage. The second diode-connected transistor has a first node coupled to a second node of the fourth transistor, and a second node coupled to a control node of the second diode-connected transistor. Furthermore, the fifth transistor has a control node coupled to the second voltage input signal, a first node coupled to the first reference voltage, and a second node coupled to the second node of the fourth transistor, wherein a first level-shifted output signal corresponding to the first voltage input signal is generated at the second node of the fourth transistor.

According to a second embodiment of the present invention, a level shift circuit is disclosed. The level shift circuit comprises a first transistor, a second transistor, a first diode-connected transistor, a third transistor, a fourth transistor, a second diode-connected transistor, and a fifth transistor. The first transistor has a first node coupled to a first reference voltage, and a control node receiving a first voltage input signal. The second transistor has a first node coupled to a second reference voltage. The first diode-connected transistor has a first node coupled to a second node of the second transistor, and a second node coupled to a control node of the first diode-connected transistor. The third transistor has a first node coupled to the first reference voltage, and a control node for receiving a second voltage input signal, wherein the first voltage input signal is an inverse version of the second voltage input signal. The fourth transistor has a first node coupled to the second reference voltage. The second diode-connected transistor has a first node coupled to a second node of the fourth transistor, and a second node coupled to a control node of the second diode-connected transistor. Furthermore, the fifth transistor has a control node coupled to the second voltage input signal, a first node coupled to the second reference voltage, and a second node coupled to the second node of the third transistor, wherein a first level-shifted output signal corresponding to the first voltage input signal is generated at the second node of the fourth transistor.

According to a third embodiment of the present invention, a source driver, characterized in comprising a level shifter, is disclosed. The level shifter comprises a first transistor, a second transistor, a first diode-connected transistor, a third transistor, a fourth transistor, a second diode-connected transistor, and a fifth transistor. The first transistor has a first node coupled to a first reference voltage, and a control node receiving a first voltage input signal. The second transistor has a first node coupled to a second reference voltage. The first diode-connected transistor has a first node coupled to a second node of the second transistor, and a second node coupled to a control node of the first diode-connected transistor. The third transistor has a first node coupled to the first reference voltage, and a control node receiving a second voltage input signal (S2), wherein the first voltage input signal is an inverse version of the second voltage input signal. The fourth transistor has a first node coupled to the second reference voltage. The second diode-connected transistor has a first node coupled to a second node of the fourth transistor, and a second node coupled to a control node of the second diode-connected transistor. Furthermore, the fifth transistor has a control node coupled to the second voltage input signal, a first node coupled to the first reference voltage, and a second node coupled to the second node of the fourth transistor, wherein a first level-shifted output signal corresponding to the first voltage input signal is generated at the second node of the fourth transistor.

According to a fourth embodiment of the present invention, a source driver, characterized in comprising a level shifter, is disclosed. The level shift circuit comprises a first transistor, a second transistor, a first diode-connected transistor, a third transistor, a fourth transistor, a second diode-connected transistor, and a fifth transistor. The first transistor has a first node coupled to a first reference voltage, and a control node receiving a first voltage input signal. The second transistor has a first node coupled to a second reference voltage. The first diode-connected transistor has a first node coupled to a second node of the second transistor, and a second node coupled to a control node of the first diode-connected transistor. The third transistor has a first node coupled to the first reference voltage, and a control node for receiving a second voltage input signal, wherein the first voltage input signal is an inverse version of the second voltage input signal. The fourth transistor has a first node coupled to the second reference voltage. The second diode-connected transistor has a first node coupled to a second node of the fourth transistor, and a second node coupled to a control node of the second diode-connected transistor. Furthermore, the fifth transistor has a control node coupled to the second voltage input signal, a first node coupled to the second reference voltage, and a second node coupled to the second node of the third transistor, wherein a first level-shifted output signal corresponding to the first voltage input signal is generated at the second node of the fourth transistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
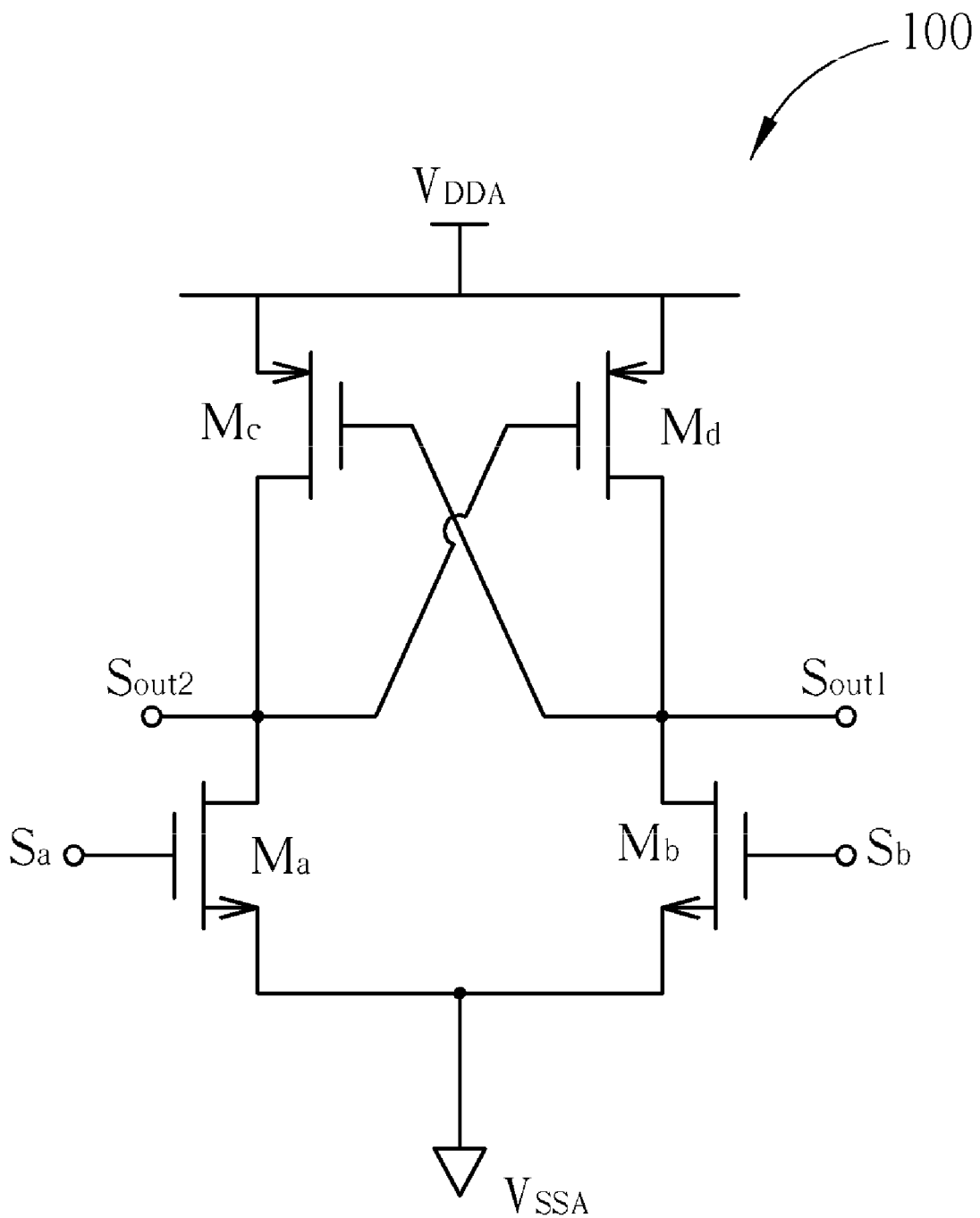
FIG. 1 is a diagram illustrating a level shift circuit of prior art.
Figure 2:
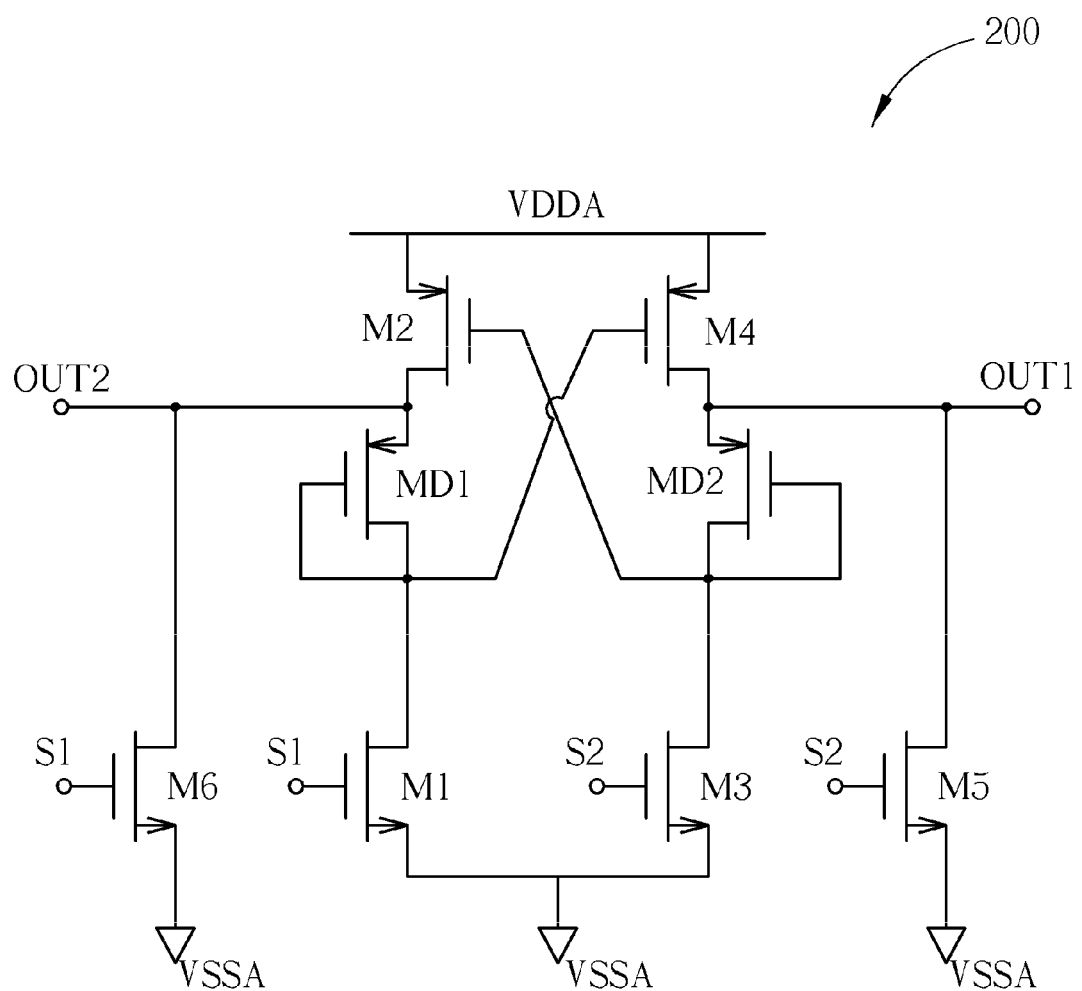
FIG. 2 is a diagram illustrating a level shift circuit according to an embodiment of the present invention.

Please refer to FIG. 2. FIG. 2 is a diagram illustrating a level shift circuit 200 according to an embodiment of the present invention. It should be noted that the level shift circuit 200 can be a level shifter applicable in a source driver. The level shift circuit 200 comprises an NMOS transistor M1, having a source node coupled to a reference voltage, which is a second supply voltage VSSA, and a gate node for receiving a first voltage input signal S1; a PMOS transistor M2, having a source node coupled to another reference voltage, which is a first supply voltage VDDA; a diode-connected PMOS transistor MD1, having a source node coupled to a drain node of the PMOS transistor M2, and a drain node coupled to a gate node of the diode-connected PMOS transistor MD1; an NMOS transistor M3, having a source node coupled to the second supply voltage VSSA, and a gate node for receiving a second voltage input signal S2; a PMOS transistor M4, having a source node coupled to the first supply voltage VDDA; a diode-connected PMOS transistor MD2, having a source node coupled to a drain node of the PMOS transistor M4, and a drain node coupled to a gate node of the diode-connected PMOS transistor MD2; and an NMOS transistor M5, having a gate node coupled to the second voltage input signal S2, a source node coupled to the second supply voltage VSSA, and a drain node coupled to the drain node of the PMOS transistor M4, wherein a first level-shifted output signal OUT1 corresponding to the first voltage input signal S1 is generated at the drain node of the PMOS transistor M4. In addition, the level shift circuit 200 further comprises an NMOS transistor M6, having a gate node coupled to the first voltage input signal S1, a source node coupled to the second supply voltage VSSA, and a drain node coupled to the drain node of the PMOS transistor M2, wherein a second level-shifted output signal OUT2 corresponding to the second voltage input signal S2 is generated at the drain node of the PMOS transistor M2. The first voltage input signal S1 is an inverse version of the second voltage input signal S2. In other words, the first voltage input signal S1 and the second voltage input signal S2 can be configured as a differential signal.

According to the embodiment of the present invention, when the first voltage input signal S1 is at a high voltage level and the second voltage input signal S2 is at a low voltage level, the cross-coupled configuration that consists of transistors M2, M4, MD1, and MD2 outputs the second level-shifted output signal OUT2 that is substantially equal to the first supply voltage VDDA. In other words, the PMOS transistor M4 charges the drain node of the PMOS transistor M4 into the first supply voltage VDDA. The cross-coupled configuration also outputs the first level-shifted output signal OUT1 that is substantially equal to the second supply voltage VSSA plus a threshold voltage Vth of the diode-connected PMOS transistor MD1. Meanwhile, since the NMOS transistor M6 is turned on by the high voltage level of the first voltage input signal S1, the NMOS transistor M6 clamps the second level-shifted output signal OUT2 to the second supply voltage VSSA. Similarly, when the first voltage input signal S1 is at the low voltage level and the second voltage input signal S2 is at the high voltage level, the PMOS transistor M2 charges the drain node of the PMOS transistor M2 into the first supply voltage VDDA, and the NMOS transistor M5 clamps the first level-shifted output signal OUT1 into the second supply voltage VSSA. Therefore, according to the embodiment of the present invention, the level shift circuit 200 is able to generate the first level-shifted output signal OUT1 and the second level-shifted output signal OUT2 equal to the first supply voltage VDDA or the second supply voltage VSSA, depending on the first voltage input signal S1 and the second voltage input signal S2.

Please note that, the present invention is not limited to coupling the NMOS transistor M5 to the drain node of the PMOS transistor M4 and coupling the NMOS transistor M6 to the drain node of the PMOS transistor M2 at the same time; in other words, coupling either one of the NMOS transistor M5 to the drain node of the PMOS transistor M4 or the NMOS transistor M6 to the drain node of the PMOS transistor M2 belongs within the scope of the present invention.

Figure 3:
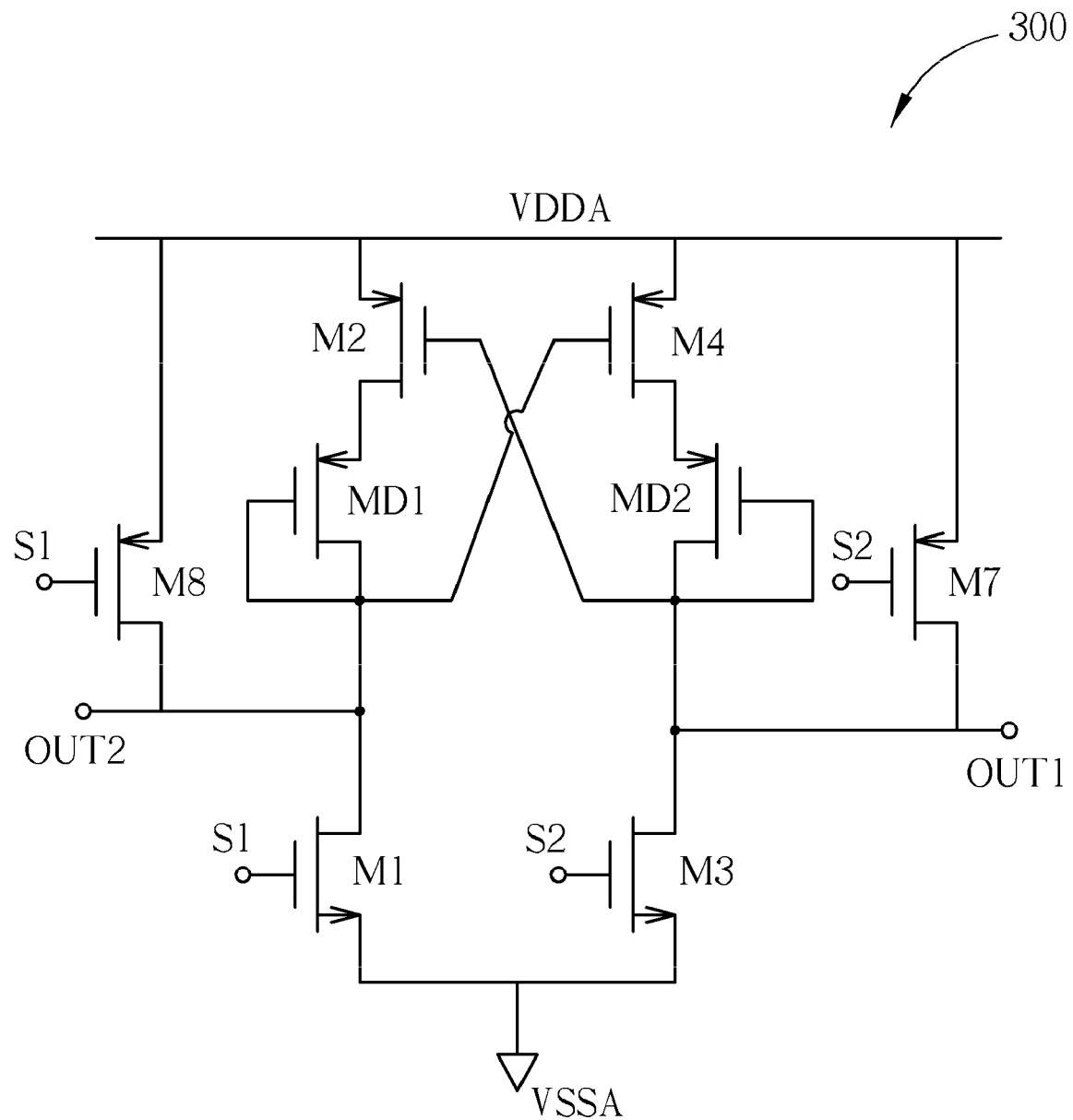
FIG. 3 is a diagram illustrating a level shift circuit according to another embodiment of the present invention.

Please refer to FIG. 3. FIG. 3 is diagram illustrating a level shift circuit 300 according to another embodiment of the present invention. It should be noted that the level shift circuit 300 can be a level shifter applicable in a source driver. The level shift circuit 300 has a similar configuration to the level shift circuit 200 as shown in FIG. 2 except for the following differences: the NMOS transistor M5 in the level shift circuit 200 is replaced by a PMOS transistor M7, having a gate node coupled to the second voltage input signal S2, a source node coupled to the first supply voltage VDDA, and a drain node coupled to the drain node of the NMOS transistor M3; and the NMOS transistor M6 in the level shift circuit 200 is replaced by a PMOS transistor M8, having a gate node coupled to the first voltage input signal S1, a source node coupled to the first supply voltage VDDA, and a drain node coupled to the drain node of the NMOS transistor M1.

Similarly, when the first voltage input signal S1 is at a high voltage level and the second voltage input signal S2 is at a low voltage level, the cross-coupled configuration that consists of transistors M2, M4, MD1, and MD2 outputs the first level-shifted output signal OUT1 that is substantially equal to the first supply voltage VDDA minus a threshold voltage Vth of the diode-connected PMOS transistor MD2. Meanwhile, since the PMOS transistor M7 is turned on by the low voltage level of the second voltage input signal S2, the PMOS transistor M7 clamps the first level-shifted output signal OUT1 into the first supply voltage VDDA. The cross-coupled configuration also outputs the second level-shifted output signal OUT2 that is substantially equal to the second supply voltage VSSA. In other words, the NMOS transistor M1 discharges the drain node of the NMOS transistor M1 into the second supply voltage VSSA. Similarly, when the first voltage input signal S1 is at the low voltage level and the second voltage input signal S2 is at the high voltage level, the NMOS transistor M3 discharges the drain node of the NMOS transistor M3 into the second supply voltage VSSA, and the PMOS transistor M8 clamps the second level-shifted output signal OUT2 into the first supply voltage VDDA. Therefore, according to the embodiment of the present invention, the level shift circuit 300 is able to generate the first level-shifted output signal OUT1 and the second level-shifted output signal OUT2 equal to the first supply voltage VDDA or the second supply voltage VSSA, depending on the first voltage input signal S1 and the second voltage input signal S2.

Those skilled in the art will readily observe that numerous modifications and alterations of the device and method may be made while retaining the teachings of the invention.

What is claimed is:

1. A level shift circuit, comprising:
 a first transistor, having a first node coupled to a first reference voltage, and a control node for receiving a first voltage input signal;
 a second transistor, having a first node coupled to a second reference voltage;
 a first diode-connected transistor, having a first node coupled to a second node of the second transistor, and a second node coupled to a control node of the first diode-connected transistor and a second node of the first transistor;
 a third transistor, having a first node coupled to the first reference voltage, and a control node for receiving a second voltage input signal, wherein the first voltage input signal is an inverse version of the second voltage input signal;
 a fourth transistor, having a first node coupled to the second reference voltage;
 a second diode-connected transistor, having a first node coupled to a second node of the fourth transistor, and a second node coupled to a control node of the second diode-connected transistor and a second node of the third transistor; and
 a fifth transistor, having a control node coupled to the second voltage input signal, a first node coupled to the first reference voltage, and a second node coupled to the second node of the fourth transistor, wherein a first level-shifted output signal corresponding to the first voltage input signal is generated at the second node of the fourth transistor;
wherein the second node of the first diode-connected transistor is coupled to a control node of the fourth transistor, the second node of the second diode-connected transistor is coupled to a control node of the second transistor, and the second transistor, the fourth transistor, the first diode-connected transistor, and the second diode-connected transistor are arranged in a cross-coupled configuration.

2. The level shift circuit of claim 1, further comprising:
 a sixth transistor, having a control node coupled to the first voltage input signal, a first node coupled to the first reference voltage, and a second node coupled to the second node of the second transistor, wherein a second level-shifted output signal corresponding to the second voltage input signal is generated at the second node of the second transistor.

3. The level shift circuit of claim 1, wherein the second reference voltage is higher than the first reference voltage.

4. The level shift circuit of claim 2, wherein the first transistor, the third transistor, the fifth transistor, the sixth transistor are N-type transistors, and the first diode-connected transistor, the second diode-connected transistor, the second transistor, and the fourth transistor are P-type transistors.

5. A level shift circuit, comprising:
 a first transistor, having a first node coupled to a first reference voltage, and a control node for receiving a first voltage input signal;
 a second transistor, having a first node coupled to a second reference voltage;
 a first diode-connected transistor, having a first node coupled to a second node of the second transistor, and a second node coupled to a control node of the first diode-connected transistor and a second node of the first transistor;
 a third transistor, having a first node coupled to the first reference voltage, and a control node for receiving a second voltage input signal, wherein the first voltage input signal is an inverse version of the second voltage input signal;
 a fourth transistor, having a first node coupled to the second reference voltage;
 a second diode-connected transistor, having a first node coupled to a second node of the fourth transistor, and a second node coupled to a control node of the second diode-connected transistor and a second node of the third transistor; and
 a fifth transistor, having a control node coupled to the second voltage input signal, a first node coupled to the second reference voltage, and a second node coupled to the second node of the third transistor, wherein a first level-shifted output signal corresponding to the first voltage input signal is generated at the second node of the fourth transistor;
wherein the second node of the first diode-connected transistor is coupled to a control node of the fourth transistor, the second node of the second diode-connected transistor is coupled to a control node of the second transistor.

6. The level shift circuit of claim 5, further comprising:
 a sixth transistor, having a control node coupled to the first voltage input signal, a first node coupled to the second reference voltage, and a second node coupled to the second node of the first transistor, wherein a second level-shifted output signal corresponding to the second voltage input signal is generated at the second node of the second transistor.

7. The level shift circuit of claim 5, wherein the second reference voltage is higher than the first reference voltage.

8. The level shift circuit of claim 6, wherein the first transistor, the third transistor are N-type transistors, and the first diode-connected transistor, the second diode-connected transistor, the second transistor, the fourth transistor, the fifth transistor, and the sixth transistor are P-type transistors.

9. The level shift circuit of claim 5, wherein the second transistor, the fourth transistor, the first diode-connected transistor, and the second diode-connected transistor are arranged in a cross-coupled configuration.

10. A source driver, characterized in comprising a level shifter, the level shifter comprising:
   a first transistor, having a first node coupled to a first reference voltage, and a control node for receiving a first voltage input signal;
   a second transistor, having a first node coupled to a second reference voltage;
   a first diode-connected transistor, having a first node coupled to a second node of the second transistor, and a second node coupled to a control node of the first diode-connected transistor and a second node of the first transistor;
   a third transistor, having a first node coupled to the first reference voltage, and a control node for receiving a second voltage input signal, wherein the first voltage input signal is an inverse version of the second voltage input signal;
   a fourth transistor, having a first node coupled to the second reference voltage;
   a second diode-connected transistor, having a first node coupled to a second node of the fourth transistor, and a second node coupled to a control node of the second diode-connected transistor and a second node of the third transistor; and
   a fifth transistor, having a control node coupled to the second voltage input signal, a first node coupled to the first reference voltage, and a second node coupled to the second node of the fourth transistor, wherein a first level-shifted output signal corresponding to the first voltage input signal is generated at the second node of the fourth transistor;
wherein the second node of the first diode-connected transistor is coupled to a control node of the fourth transistor, the second node of the second diode-connected transistor is coupled to a control node of the second transistor, and the second transistor, the fourth transistor, the first diode-connected transistor, and the second diode-connected transistor are arranged in a cross-coupled configuration.

11. The source driver of claim 10, wherein the level shifter further comprises:
   a sixth transistor, having a control node coupled to the first voltage input signal, a first node coupled to the first reference voltage, and a second node coupled to the second node of the second transistor, wherein a second level-shifted output signal corresponding to the second voltage input signal is generated at the second node of the second transistor.

12. The source driver of claim 10, wherein the second reference voltage is higher than the first reference voltage.

13. The source driver of claim 11, wherein the first transistor, the third transistor, the fifth transistor, the sixth transistor are N-type transistors, and the first diode-connected transistor, the second diode-connected transistor, the second transistor, and the fourth transistor are P-type transistors.

14. A source driver, characterized in comprising a level shifter, the level shifter comprising:
   a first transistor, having a first node coupled to a first reference voltage, and a control node for receiving a first voltage input signal;
   a second transistor, having a first node coupled to a second reference voltage;
   a first diode-connected transistor, having a first node coupled to a second node of the second transistor, and a second node coupled to a control node of the first diode-connected transistor and a second node of the first transistor;
   a third transistor, having a first node coupled to the first reference voltage, and a control node for receiving a second voltage input signal, wherein the first voltage input signal is an inverse version of the second voltage input signal;
   a fourth transistor, having a first node coupled to the second reference voltage;
   a second diode-connected transistor, having a first node coupled to a second node of the fourth transistor, and a second node coupled to a control node of the second diode-connected transistor and a second node of the third transistor; and
   a fifth transistor, having a control node coupled to the second voltage input signal, a first node coupled to the second reference voltage, and a second node coupled to the second node of the third transistor, wherein a first level-shifted output signal corresponding to the first voltage input signal is generated at the second node of the fourth transistor;
wherein the second node of the first diode-connected transistor is coupled to a control node of the fourth transistor, the second node of the second diode-connected transistor is coupled to a control node of the second transistor.

15. The source driver of claim 14, wherein the level shifter further comprises:
   a sixth transistor, having a control node coupled to the first voltage input signal, a first node coupled to the second reference voltage, and a second node coupled to the second node of the first transistor, wherein a second level-shifted output signal corresponding to the second voltage input signal is generated at the second node of the second transistor.

16. The source driver of claim 14, wherein the second reference voltage is higher than the first reference voltage.

17. The source driver of claim 15, wherein the first transistor, the third transistor are N-type transistors, and the first diode-connected transistor, the second diode-connected transistor, the second transistor, the fourth transistor, the fifth transistor, and the sixth transistor are P-type transistors.

18. The source driver of claim 14, wherein the second transistor, the fourth transistor, the first diode-connected transistor, and the second diode-connected transistor are arranged in a cross-coupled configuration.

* * * * *